(12) United States Patent
Fan et al.

(10) Patent No.: US 12,183,846 B2
(45) Date of Patent: Dec. 31, 2024

(54) DEVICE AND METHOD FOR REMOVING METAL GALLIUM, AND LASER LIFT-OFF SYSTEM

(71) Applicant: CHONGQING KONKA PHOTOELECTRIC TECHNOLOGY RESEARCH INSTITUTE CO., LTD., Chongqing (CN)

(72) Inventors: Chunlin Fan, Chongqing (CN); Bin Wang, Chongqing (CN); Qing Wang, Chongqing (CN)

(73) Assignee: CHONGQING KONKA PHOTOELECTRIC TECHNOLOGY RESEARCH INSTITUTE CO., LTD., Chongqing (CN)

( * ) Notice: Subject to any disclaimer, the term of this patent is extended or adjusted under 35 U.S.C. 154(b) by 618 days.

(21) Appl. No.: 17/430,718

(22) PCT Filed: Jun. 16, 2020

(86) PCT No.: PCT/CN2020/096386
§ 371 (c)(1),
(2) Date: Aug. 12, 2021

(87) PCT Pub. No.: WO2021/253234
PCT Pub. Date: Dec. 23, 2021

(65) Prior Publication Data
US 2022/0416115 A1 Dec. 29, 2022

(51) Int. Cl.
*H01L 33/00* (2010.01)

(52) U.S. Cl.
CPC .......... *H01L 33/0093* (2020.05); *H01L 33/00* (2013.01)

(58) Field of Classification Search
None
See application file for complete search history.

(56) References Cited

U.S. PATENT DOCUMENTS

| 10,020,212 B1* | 7/2018 | Pourchet ............. H01L 33/0093 |
| 10,304,706 B2 | 5/2019 | Pourchet et al. |
| 2002/0096578 A1* | 7/2002 | Al-Jiboory ............. B08B 3/123 |
| | | 239/102.1 |

(Continued)

FOREIGN PATENT DOCUMENTS

| CN | 103367209 A | 10/2013 |
| CN | 104362238 A | 2/2015 |

(Continued)

OTHER PUBLICATIONS

Translation 104362238 (Year: 2014).*
International Search Report for corresponding application PCT/CN2020/096386 filed Jun. 16, 2020; Mail date Mar. 17, 2021.

*Primary Examiner* — Bradley Smith
(74) *Attorney, Agent, or Firm* — Samson G. Yu

(57) ABSTRACT

The present disclosure relates to a device and method for removing metal gallium, and a laser lift-off system. The device includes a device body, and the device body includes a process chamber (10), wherein fluid used for removing metal gallium left on the surfaces of multiple Micro Light Emitting Diode (Micro-LED) chips after laser lift-off is contained in the process chamber (10); and a temperature of the fluid is greater than or equal to a melting point of metal gallium.

19 Claims, 4 Drawing Sheets

(56) References Cited

U.S. PATENT DOCUMENTS

| | | | |
|---|---|---|---|
| 2005/0173003 A1* | 8/2005 | Laverdiere | G05D 16/2013 |
| | | | 137/487.5 |
| 2007/0000521 A1 | 1/2007 | Fury et al. | |
| 2009/0139452 A1* | 6/2009 | Hofmann | C23C 14/568 |
| | | | 118/719 |
| 2009/0147819 A1* | 6/2009 | Goodman | G01K 15/00 |
| | | | 374/1 |
| 2009/0206056 A1* | 8/2009 | Xu | H01J 37/32449 |
| | | | 156/345.26 |
| 2020/0066552 A1* | 2/2020 | Susa | C23C 16/4482 |
| 2022/0315472 A1* | 10/2022 | Kanno | B23K 26/0006 |

FOREIGN PATENT DOCUMENTS

| | | |
|---|---|---|
| CN | 107768487 A | 3/2018 |
| CN | 109256336 A | 1/2019 |
| CN | 109326698 A | 2/2019 |
| CN | 110246749 A | 9/2019 |
| CN | 111128843 A | 5/2020 |
| CN | 210533986 U | 5/2020 |
| JP | 2002076523 A | 3/2002 |
| JP | 2018041875 A | 3/2018 |
| WO | 2018215893 A1 | 11/2018 |

* cited by examiner

DEVICE AND METHOD FOR REMOVING METAL GALLIUM, AND LASER LIFT-OFF SYSTEM

CROSS REFERENCE

This application is a National Stage Filing of the PCT International Application No. PCT/CN2020/096386 filed on Jun. 16, 2020, the entirety of which is herein incorporated by reference.

TECHNICAL FIELD

The present disclosure relates to the technical field of semiconductors, and particularly relates to a device and method for removing metal gallium, and a laser lift-off system.

BACKGROUND

Micro Light Emitting Diode (Micro-LED) technologies are new generation display technologies, among which a Micro-LED mass transfer technology is an extremely important part of Micro-LED manufacturing. The Micro-LED mass transfer technology is a technology for transferring thousands of Micro-LEDs from a growth substrate to a target substrate. Metal gallium may be left on electrodes of Micro-LED chips after a laser lift-off process of a mass transfer stage. At present, metal gallium is usually removed by washing the electrodes on the Micro-LED chips with acid (diluted hydrochloric acid). Although residual metal gallium can be removed through washing the electrodes on the Micro-LED chips with acid, acid may corrode the electrodes on the Micro-LED chips in the washing process, which easily damages the Micro-LED chips.

Therefore, how to remove residual metal gallium without damaging the Micro-LED chips is a problem that needs to be solved urgently.

SUMMARY

The present disclosure relates to a device and a method for removing metal gallium, and a laser lift-off system, which provides a technical solution for removing residual metal gallium without damaging Micro-LED chips and electrodes.

The technical solution of the embodiments of the present disclosure is as follows.

A device for removing metal gallium includes:
a device body, wherein the device body includes a process chamber;
fluid used for removing metal gallium left on the surfaces of multiple Micro-LED chips after laser lift-off is contained in the process chamber; and
a temperature of the fluid is greater than or equal to a melting point of metal gallium.

According to the device, the fluid with the temperature greater than or equal to the melting point of metal gallium is contained in the process chamber, and metal gallium can transfer from a solid state into a molten state by utilizing the fluid, so that the purpose of removing metal gallium is achieved. The device is simple in structure and easy to operate.

Based on the same application concept, the embodiments of the present disclosure also provide a method for removing metal gallium, which is based on a device for removing metal gallium. The device includes a process chamber. The method includes the following operations.

A temporary storage substrate after laser lift-off is provided, wherein multiple Micro-LED chips are adhered to the temporary storage substrate.

The temporary storage substrate is transferred into the process chamber.

A specific amount of fluid is introduced into the process chamber to remove residual metal gallium on surfaces of the multiple Micro-LED chips.

A temperature of the fluid is greater than or equal to a melting point of metal gallium.

According to the method, the fluid with the temperature greater than or equal to the melting point of metal gallium is used for changing metal gallium left on the surfaces of the multiple Micro-LED chips from a solid state into a molten state, so that the molten metal gallium falls off from the surfaces of the multiple Micro-LED chips, thereby achieving the purpose of removing metal gallium. Namely, metal gallium is removed by using a physical method, and the method is simple, convenient and easy to operate.

A laser lift-off system includes:
a laser lift-off device, configured to separate a temporary storage substrate adhered with multiple Micro-LED chips from a growth substrate;
a device for removing metal gallium, wherein the device includes a process chamber, fluid used for removing metal gallium left on surfaces of the multiple Micro-LED chips after laser lift-off is contained in the process chamber, and a temperature of the fluid is greater than or equal to a melting point of metal gallium; and
a transfer device, configured to transfer the temporary storage substrate after laser lift-off into the process chamber.

According to the system, the temporary storage substrate after lift-off by the laser lift-off device is transferred into the process chamber through the transfer device, residual metal gallium is removed by utilizing the fluid in the process chamber, and the system can be used for mass production.

DESCRIPTION OF REFERENCE NUMERALS

Figure 1:
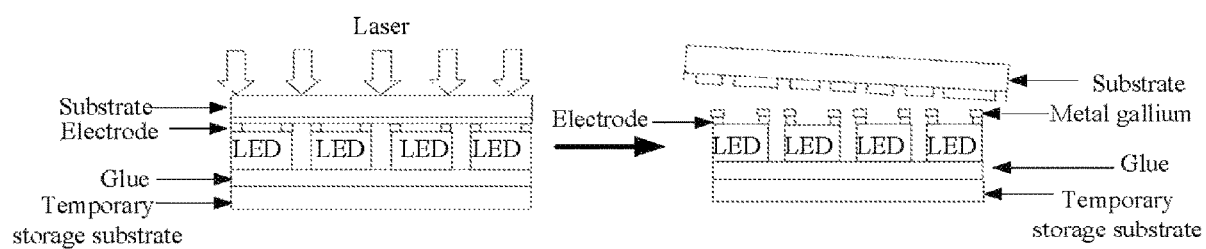
FIG. 1 is a schematic diagram of a laser lift-off process in the related art.

10—process chamber; 11—temperature sensor; 12—liquid level sensor; 13—vacuum degree sensor; 100—fluid inlet; 101—valve; 102—temperature detector; 103—flow detector; 104—electronic pressure gauge; 110—fluid outlet; 111—valve; 112—temperature detector; 113—flow detector; 114—electronic pressure gauge; 120—extraction opening; 200—laser lift-off device; 300—device for removing metal gallium;

400—transfer device; 210—laser source; 211—laser galvanometer; 220—control device.

DETAILED DESCRIPTION OF THE EMBODIMENTS

In order to facilitate an understanding of the present disclosure, a more complete description of the present disclosure will now be made with reference to the associated drawings. Exemplary implementations of the present disclosure are given in the drawings. However, the present disclosure may be realized in many different forms and is not limited to the implementations described herein. Rather, these implementations are provided so as to facilitate a more thorough and complete understanding of the content of the present disclosure.

Unless defined otherwise, all technical and scientific terms used herein have the same meaning as commonly understood by those having ordinary skill in the art to which this disclosure belongs. The terms used in the specification of the present disclosure herein is for the purpose of describing the exemplary implementations only and is not intended to be limiting of the present disclosure.

Micro Light Emitting Diode (Micro-LED) technologies are new generation display technologies, among which a Micro-LED mass transfer technology is an extremely important part of Micro-LED manufacturing. The Micro-LED mass transfer technology is a technology for transferring thousands of Micro-LEDs from a growth substrate to a target substrate. In the transfer process, the Micro-LED chips are usually adhered to a temporary storage substrate first, then the Micro-LED chips are stripped from the growth substrate by using a laser lift-off technology, and finally, the temporary storage substrate adhered with the Micro-LED chips and the target substrate are bonded.

In an exemplary technology, the material of the connecting part of the Micro-LED chips and the growth substrate is GaN (gallium nitride), which may be partially decomposed to generate nitrogen ($2GaN \rightarrow 2Ga+N_2$) when being irradiated by laser. Therefore, in a case where the material of the connecting part of the Micro-LEDs and the growth substrate is GaN, when the side, away from the Micro-LEDs, of the growth substrate is irradiated by laser, the laser may irradiate to the side of the Micro-LEDs through the transparent growth substrate, then part of GaN at the connecting part of the Micro-LEDs and the growth substrate is decomposed to generate nitrogen, which may form certain thrust to make the Micro-LEDs fall off from the growth substrate. Some metal gallium may be left on the surfaces of electrodes of the Micro-LEDs after falling off, as shown in FIG. 1. The residual metal gallium on the Micro-LED chips after laser lift-off may usually be removed by acid, but in the acid washing process, acid may corrode the electrodes on the Micro-LED chips, which easily damages the Micro-LED chips.

Based on this, the embodiments of the present disclosure provide a solution capable of solving the above technical problem, the details of which will be set forth in the following embodiments.

Figure 2:
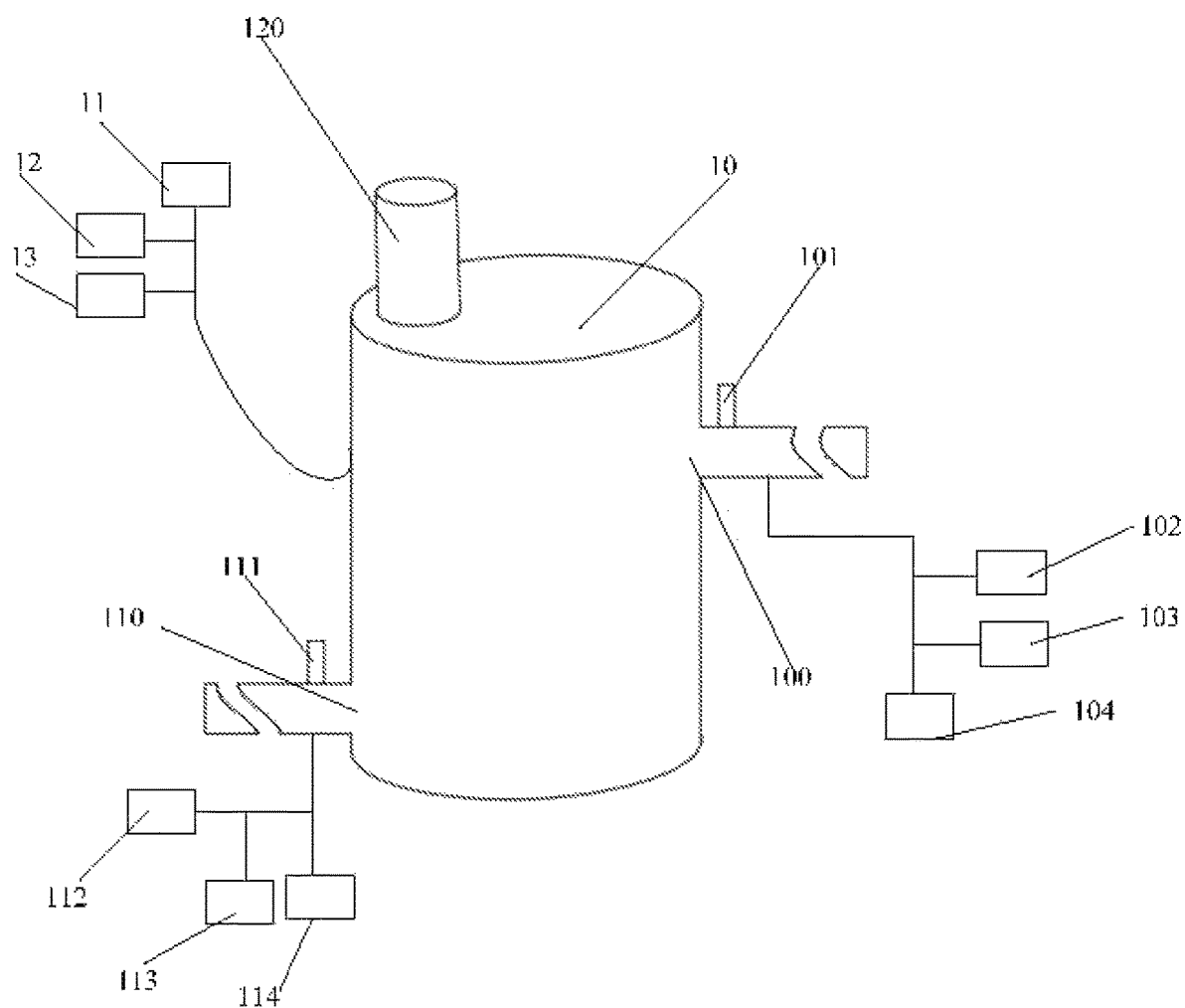
FIG. 2 is a structural schematic diagram of a device for removing metal gallium according to an embodiment of the present disclosure.

Referring to FIG. 2, as shown in FIG. 2, the embodiment of the present disclosure provides a device for removing metal gallium. The device for removing metal gallium includes a device body, and the device body includes a process chamber 10. Fluid used for removing metal gallium left on the surfaces of multiple Micro-LED chips after laser lift-off is contained in the process chamber 10, and a temperature of the fluid is greater than or equal to a melting point of metal gallium.

In the embodiment, the process chamber 10 may be an open-topped or fully sealed container. As will be readily understood, the process chamber 10 is provided with an opening for placing and taking the Micro-LED chips. The specific dimensions of the process chamber 10 may be set according to actual needs and are not limited herein. The shape of the process chamber 10 may be cylindrical, square-slot-shaped or the like, and the material of the process chamber 10 may be metal or plastic. The shape and the material of the process chamber 10 are not limited herein.

In an implementation of the embodiment, a temperature sensor 11 configured to detect the temperature of the fluid (the fluid inside the process chamber 10) is also arranged on the inner surface of the process chamber 10, and the temperature of the fluid inside the process chamber 10 is detected by the temperature sensor 11 in real time, so that the temperature of the fluid meets the process requirements. The temperature sensor 11 may be an electronic temperature sensor or other types of temperature sensors.

In an implementation of the embodiment, a liquid level sensor 12 configured to detect the level of the fluid is also arranged on the inner surface of the process chamber 10 to detect the level of the fluid inside the process chamber 10, so as to prevent the influence of over low fluid level (lower than a lower limit of liquid level setting) or over high fluid level (higher than an upper limit of liquid level setting) on the removal effect of metal gallium. The set lower limit of the liquid level may be at a position of 30% of the volume of the process chamber 10, or at a position of 40% of the volume of the process chamber 10, or at a position of 20% of the volume of the process chamber 10. The set upper limit of the liquid level may be at a position of 70% of the volume of the process chamber 10, or at a position of 80% of the volume of the process chamber 10, or at a position of 90% of the volume of the process chamber 10.

In an implementation of the embodiment, a fluid inlet 100 is arranged on the process chamber 10, and a valve 101 configured to control the flow of the fluid, a temperature detector 102 configured to detect the temperature of the fluid at the fluid inlet 100, and a flow detector 103 configured to detect the flow of the fluid at the fluid inlet 100 are arranged at the fluid inlet 100. The valve 101 may be a switch solenoid valve with a feedback function, and remote control may be carried out through the switch solenoid valve with the feedback function. The temperature detector 102 may be of the same type and model as the temperature detector arranged in the process chamber 10, or may adopt a different type and model compared with the temperature detector arranged in the process chamber 10. The flow detector 103 may be an electronic flow meter, a rotameter, or the like. As will be readily understood, an electronic pressure gauge 104 may also be provided to detect the pressure at the fluid inlet 100. The injected fluid may be conveniently controlled by arranging the electronic flow meter and the electronic pressure gauge. For example, the flow of the fluid entering the process chamber 10 may be reduced if a low pressure of the fluid at the inlet is detected by the electronic pressure gauge, due to the fact that an outlet is open, fluctuating of liquid level easily occurs if adjustment is not carried out, and thus the removal of metal gallium is influenced. In such a case, adjustment may be carried out by adjusting the opening degree of the solenoid valve at the outlet, or increasing pressure at the inlet.

In an implementation of the embodiment, a fluid outlet 110 is provided on the process chamber 10, and a valve 111 configured to control the flow of the fluid, a temperature detector 112 configured to detect the temperature of the fluid at the fluid outlet 110, and a flow detector 113 configured to detect the flow of the fluid at the fluid outlet 110 are provided at the fluid outlet 110. The valve 111 may be a switch solenoid valve with a feedback function, and remote control may be carried out through the switch solenoid valve with the feedback function. The temperature detector 112 may be of the same type and model as the temperature detector arranged in the process chamber 10, or may adopt a different type and model compared with the temperature detector arranged in the process chamber 10. The flow detector 113 may be an electronic flow meter, a rotameter, or the like. As will be readily understood, an electronic pressure gauge 114 may also be arranged to detect the pressure at the fluid outlet.

As will be readily understood, during continuous production, the temperature inside the process chamber 10 is not uniform, in order to ensure the removal efficiency of metal gallium (for example, at temperature below 35 degree Celsius, although metal gallium can be removed from a solid state to a molten state, the removal rate is relatively low), the temperature detector 112 may be arranged to detect the temperature of the fluid flowing out, and the temperature of the fluid inside the process chamber 10 may be reversely evaluated based on the detection result. For example, if the temperature of the fluid flowing out is 33 degree Celsius, and the temperature of the fluid detected by the temperature sensor 11 on the inner surface of the process chamber 10 is 40 degree Celsius, this means that the temperature of the fluid inside the process chamber 10 is low in partial areas, and in order to improve the removal efficiency of metal gallium, adjustment may be carried out by increasing the temperature of the introduced fluid.

In the embodiment, the fluid inlet 100 is arranged above the process chamber 10, and the fluid outlet 110 is arranged below the process chamber 10, i.e., the fluid inlet 100 is arranged at an upper portion of the process chamber 10, and the fluid outlet 110 is arranged at a lower portion of the process chamber 10. During the removing process, the process chamber 10 is replenished with fluid from above, so that disturbance to the fluid at the bottom may be avoided, and further, the removal effect may be prevented from being influenced.

In an implementation of the embodiment, a vacuum degree sensor 13 configured to detect the vacuum degree inside the process chamber 10 is also provided on the process chamber 10. In the process that the fluid flows in and out of the process chamber 10 and the Micro-LED chips are taken and placed, the vacuum degree in the process chamber 10 may be influenced to a certain degree. To address this problem, a vacuumizing extraction opening 120 is formed in the top of the process chamber 10 for vacuumizing the process chamber 10, thus the vacuum atmosphere of the process chamber 10 is guaranteed. The extraction opening 120 is connected with a vacuum pump (not shown in the figure) through a vacuumizing pipeline (not shown in the figure).

Figure 3:
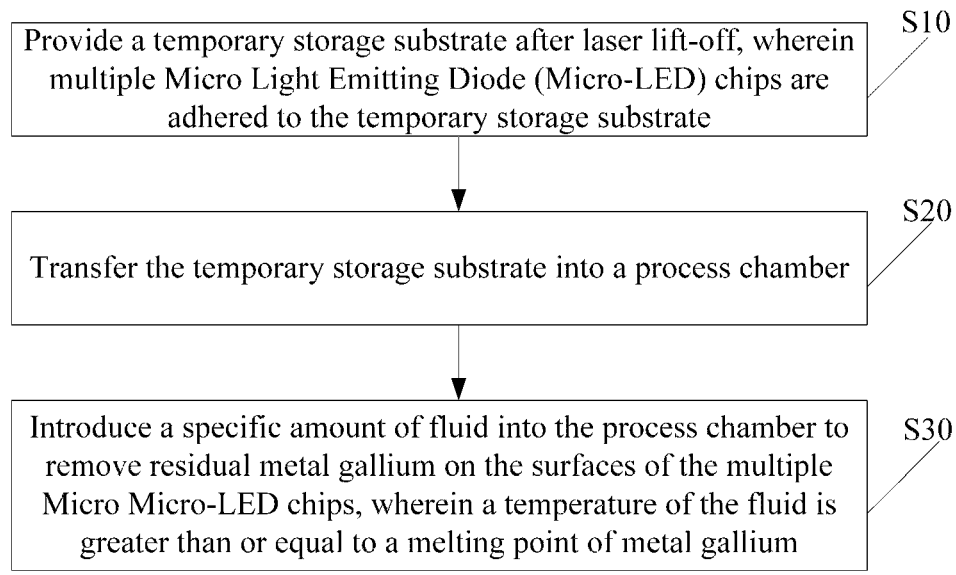
FIG. 3 is a schematic flow diagram of a method for removing metal gallium according to an embodiment of the present disclosure.

Based on the device for removing metal gallium, an embodiment of the present disclosure provides a method for removing metal gallium. As shown in FIG. 3. The method includes the following operations.

In S10, a temporary storage substrate after laser lift-off is provided, and multiple Micro-LED chips are adhered to the temporary storage substrate.

Specifically, a device for removing metal gallium is first provided. The specific structure of the provided device for removing metal gallium has been described above and will not be elaborated here. In a vacuum environment, the temporary storage substrate and a growth substrate are subjected to laser lift-off, and the multiple Micro-LED chips are adhered to the temporary storage substrate.

In S20, the temporary storage substrate is transferred into a process chamber.

In particular, the temporary storage substrate may be transferred into the process chamber 10 in a manipulator (mechanical arm) gripping manner, and it is of course also possible to transfer the temporary storage substrate in other means. As will be readily understood, for the transfer of the temporary storage substrate, one temporary storage substrate may be transferred at a time, or multiple temporary storage substrates may be transferred at a time.

In S30, a specific amount of fluid is introduced into the process chamber to remove residual metal gallium on surfaces of the multiple Micro-LED chips, and a temperature of the fluid is greater than or equal to a melting point of metal gallium.

Specifically, after the temporary storage substrate is placed inside the process chamber 10 of the device, fluid is introduced into the process chamber 10, so that metal gallium adhered on the temporary storage substrate is in contact with the fluid. Because the temperature of the fluid is greater than or equal to the melting point temperature of metal gallium, metal gallium can be changed from a solid state into a molten state, and then metal gallium may be separated from the Micro-LED chips to achieve the purpose of removing metal gallium. The fluid does not react with the multiple Micro-LED chips, and the fluid includes, but is not limited to, deionized water, ultrapure water, ethanol or the like.

Figure 4:
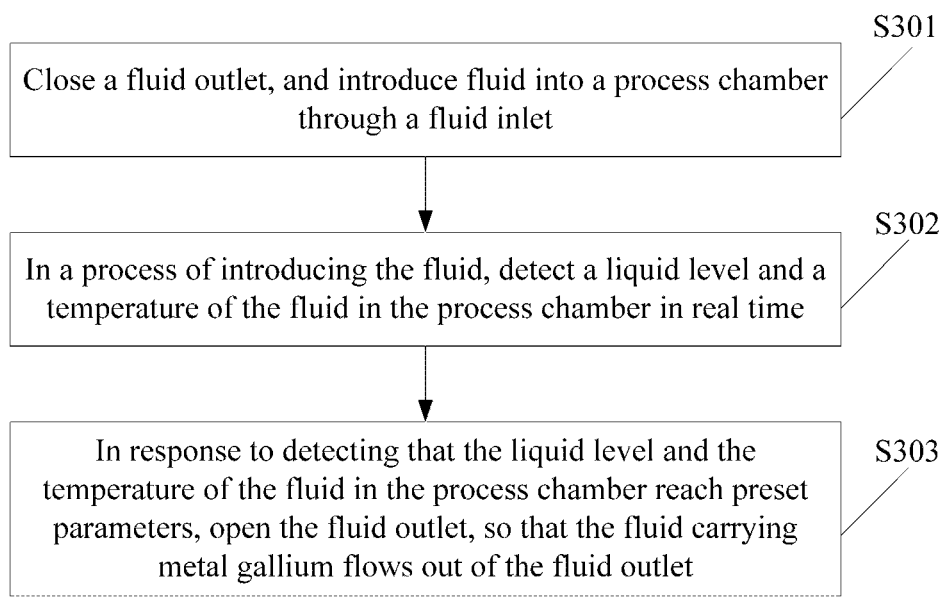
FIG. 4 is a schematic flow diagram of introducing fluid into a process chamber in a method for removing metal gallium according to an embodiment of the present disclosure.

In an implementation of the embodiment, as shown in FIG. 4, S30 includes the following sub-operations.

In S301, a fluid outlet is closed, and the fluid is introduced into the process chamber through a fluid inlet.

In S302, in a process of introducing the fluid, a liquid level and a temperature of the fluid in the process chamber are detected in real time.

In S303, in response to detecting that the liquid level and the temperature of the fluid in the process chamber reach preset parameters, the fluid outlet is opened, so that the fluid carrying metal gallium flows out of the fluid outlet.

In the embodiment, the process chamber 10 includes the fluid inlet 100 and the fluid outlet 110. A valve, a temperature detector, a pressure detector, a flow detector and the like are arranged at both the fluid inlet 100 and the fluid outlet 110. The fluid is introduced into the process chamber 10 through the fluid inlet 100 arranged on the process chamber 10, and the introduced fluid is monitored through the detectors arranged at the fluid inlet 110, so that normal removal of metal gallium is ensured.

For example, with deionized water as the fluid, the switch solenoid valve at the fluid inlet 100 is opened (while keeping the switch solenoid valve at the fluid outlet 110 closed), so that the deionized water flows into the process chamber 10. In the process that the deionized water flows in, the temperature and the liquid level of the deionized water in the process chamber 10 are monitored in real time through a temperature sensor 11 and a liquid level sensor 12 which are arranged on the inner surface of the process chamber 10. Temperature signal data detected by the temperature sensor 11 are transmitted to a host (such as a main control cabinet) connected with the temperature sensor 11, and the host responds to the temperature signal data. As will be readily understood, the host is in communication connection with a production computer, and the host is provided with temperature abnormity early warning. If the temperature is lower than the melting point of metal gallium or higher than a certain temperature such as 90 degree Celsius, an abnormity signal is sent out. For example, if the temperature sensor 11 detects that the temperature of the deionized water is 20 degree Celsius (lower than 29.78 degree Celsius), which shows that the process setting requirement is not met, then the abnormity information is fed back to the production computer, and the temperature of the deionized water at the fluid inlet 100 is adjusted by the production computer, for example, the inflow amount of the deionized water is increased, the temperature of the deionized water is increased, etc.

Similarly, liquid level signal data detected by the liquid level sensor 12 are transmitted to a host connected with the liquid level sensor 12, and the host responds to the liquid level signal data. If the liquid level of the deionized water is detected to be lower than the lower limit, abnormity information is fed back, and the opening degree of the switch solenoid valve at the fluid inlet 100 is increased through the production computer. If both the temperature and the liquid level of the deionized water in the process chamber 10 are met, the fluid inlet 100 is closed. The Micro-LED chips in the process chamber 10 are taken out after soaking. The specific soaking duration may be set according to the production rhythm. As will be readily understood, if the liquid level sensor 12 detects that the liquid level of the deionized water is higher than the preset upper limit liquid level, abnormity information is fed back, the opening degree of the switch solenoid valve at the fluid inlet 100 is adjusted through the production computer so as to close the switch solenoid valve at the fluid inlet 100, and the opening degree of the solenoid valve at the fluid outlet 110 is increased, so that the liquid level is within the process setting range. If the liquid level is normal, the opening degree of the solenoid valve at the fluid inlet 100 and the opening degree of the solenoid valve at the fluid outlet 110 may be adjusted at the same time, so that the deionized water flowing in and out of the process chamber 10 is in a dynamic balance state.

In an implementation of the embodiment, the temperature of the fluid may be 29.78 degree Celsius to 35 degree Celsius, 35 degree Celsius to 40 degree Celsius, 40 degree Celsius to 45 degree Celsius, 45 degree Celsius to 50 degree Celsius, 50 degree Celsius to 55 degree Celsius, 55 degree Celsius to 60 degree Celsius, 60 degree Celsius to 65 degree Celsius, 65 degree Celsius to 70 degree Celsius, 70 degree Celsius to 75 degree Celsius, 75 degree Celsius to 80 degree Celsius, 80 degree Celsius to 85 degree Celsius, or 85 degree Celsius to 90 degree Celsius. The melting point of metal gallium is 29.78 degree Celsius, and metal gallium can be removed by adopting a physical method based on this characteristic of metal gallium, so that the corrosion of hydrochloric acid to the Micro-LED chips and the electrodes in the current wet process is avoided, and the mass transfer yield and the quality of the Micro-LED chips are improved.

In an implementation of the embodiment, in order to prevent metal gallium left on the Micro-LED chips from being subjected to oxidation reaction (gallium oxide generated by the oxidation reaction may not be removed by the used fluid) in the process of removing metal gallium, the process chamber 10 may be filled with an inert gas, so that an inert environment is formed in the process chamber 10. The inert gas may be helium, argon, nitrogen or the like.

In an implementation of the embodiment, in order to prevent oxidation reaction of residual metal gallium on the Micro-LED chips during the transition of metal gallium from a solid state to a molten state, the method of the embodiment of the present disclosure, before introducing the fluid into the process chamber 10, may further include the following operation.

Whether a vacuum degree in the process chamber meets a preset requirement or not is judged.

Specifically, a certain vacuum degree may be formed in the process chamber 10 by way of vacuumizing. Namely, after the Micro-LED chips with the residual metal gallium on the surface are placed in the device, the process chamber 10 is closed; and the vacuum degree of the process chamber 10 is detected, and when the vacuum degree does not meet the preset vacuum degree, the process chamber 10 is vacuumized through a vacuumized extraction opening until the vacuum degree meets the preset vacuum degree.

The vacuum degree is 5 Pa to 0.2 Pa, the vacuum degree is set within the range, so that the Micro-LED chips are not oxidized when being soaked in the fluid, and meanwhile, no special equipment is needed (for keeping a harsh vacuum degree).

Figure 5:
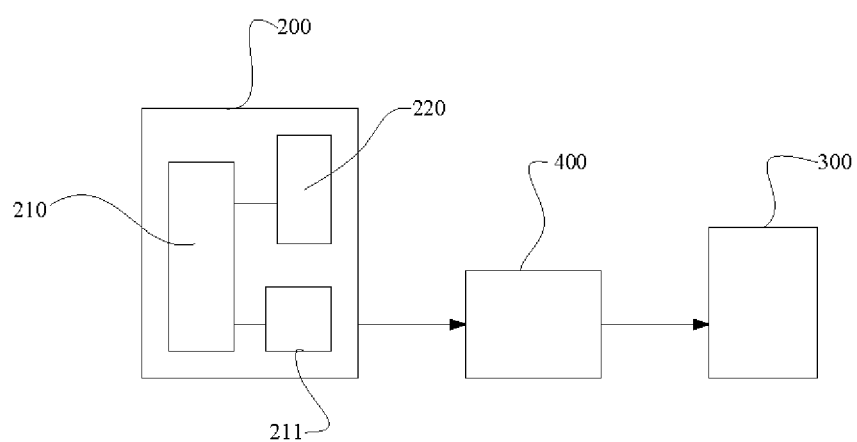
FIG. 5 is a structural schematic diagram of a laser lift-off system according to an embodiment of the present disclosure.

Based on the device and method for removing metal gallium, the embodiments of the present disclosure also provide a laser lift-off system, as shown in FIG. 5. The laser lift-off system includes a laser lift-off device 200, configured to separate a temporary storage substrate adhered with multiple Micro-LED chips from a growth substrate, wherein metal gallium is left on the multiple Micro-LED chips; a device 300 for removing metal gallium, the device includes a process chamber 10, wherein fluid used for removing metal gallium left on surfaces of the multiple Micro-LED chips after laser lift-off is contained in the process chamber 10, and a temperature of the fluid is greater than or equal to a melting point of metal gallium; and a transfer device 400, configured to transfer the temporary storage substrate after laser lift-off into the process chamber 10.

In the embodiment, the device 300 for removing metal gallium follows the same structure as the device for removing metal gallium described as above and will not be elaborated here. The laser lift-off device 200 includes a laser source 210 configured to emit a laser beam, wherein the laser source 210 is configured to emit laser at a preset wavelength; a laser galvanometer 211 arranged on a light outlet path of the laser source 210; and a control device 220 electrically connected with the laser source 210 and configured to shape the laser emitted by the laser source 210 into light spots with a preset size. The light spots may be linear light spots or point-shaped light spots. For example, the linear light spots have a length of 50 mm and a width of 0.04 mm, and the point-shaped light spots have an area of 600-605 $\mu m^2$, 605-610 $\mu m^2$, 610-615 $\mu m^2$, and 615-620 $\mu m^2$.

In a vacuum atmosphere, the control device 220 is utilized for controlling a laser beam emitted by the laser light source 210 to form the point-shaped light spots, and the laser galvanometer 211 is utilized for scanning and irradiating the growth substrate, so that the temporary storage substrate is separated from the growth substrate.

Exemplarily, the growth substrate is a sapphire growth substrate, the laser emitted by the laser source 210 is shaped into 615 $\mu m^2$ light spots by the control device 220, when the side away from the Micro-LEDs is scanned by the laser galvanometer 211, the laser may pass through the transparent sapphire growth substrate and irradiate the side of the Micro-LEDs, then part of GaN of the connecting part of the Micro-LEDs and the sapphire growth substrate is decomposed, so that the Micro-LEDs fall off from the sapphire growth substrate, and the Micro-LEDs are adhered to the temporary storage substrate through glue. As will be readily understood, the technology for controlling the laser beam by the control device 220 is conventional, the specific operation and control of which are not limited herein.

In the embodiment, the transfer device 400 may be a manipulator (mechanical arm), i.e., when the Micro-LEDs fall off from the sapphire growth substrate (i.e., laser lift-off is achieved), the Micro-LEDs are picked up by the mechanical arm and transported into the process chamber 10, and then the operations of the method for removing metal gallium described above are performed to realize removal of metal gallium.

In an implementation of the embodiment, the laser lift-off device 200 further includes a lift-off chamber (not shown in the figure) inside which the device 300 for removing metal gallium may be placed, and the Micro-LEDs may be placed in the process chamber by way of transport directly by the mechanical arm, and thus the transport time is saved.

In conclusion, the embodiments of the present disclosure provide a device and method for removing metal gallium, and a laser lift-off system. The device includes a device body, and the device body includes a process chamber, wherein fluid used for removing metal gallium left on surfaces of the multiple Micro-LED chips after laser lift-off is contained in the process chamber, and a temperature of the fluid is greater than or equal to a melting point of metal gallium. The device is simple in structure and easy to operate, and the removal of metal gallium is realized by utilizing the physical principle. The mass transfer yield and the quality of the chips are improved. Meanwhile, the device can be used for mass production.

It is to be understood that the application of the embodiments of the present disclosure is not limited to the examples described above, and modifications or variations may be made in light of the above description by those having ordinary skill in the art, all of which are intended to fall within the scope of the appended claims.

What is claimed is:

1. A device for removing metal gallium, the device for removing metal gallium is placed inside a lift-off chamber, comprising:
    a device body, comprising a process chamber;
    wherein fluid used for removing metal gallium left on surfaces of multiple Micro Light Emitting Diode (Micro-LED) chips after laser lift-off performed by a laser lift-off device is contained in the process chamber, wherein the laser lift-off device comprises the lift-off chamber; and
    a temperature of the fluid is greater than or equal to a melting point of metal gallium.

2. The device according to claim 1, further comprising one or more sensors arranged in the process chamber and configured to detect one or more process parameters in the process chamber.

3. The device according to claim 2, wherein the sensors comprise a temperature sensor and a liquid level sensor;
    the temperature sensor is configured to detect the temperature of the fluid in the process chamber; and
    the liquid level sensor is configured to detect a liquid level of the fluid in the process chamber.

4. The device according to claim 3, wherein the sensors further comprise a vacuum degree sensor, and the vacuum degree sensor is configured to detect a vacuum degree in the process chamber.

5. The device according to claim 1, wherein the process chamber comprises a fluid inlet and a fluid outlet, and each of the fluid inlet and the fluid outlet is provided with a valve for controlling flow of the fluid.

6. The device according to claim 5, wherein the fluid inlet and the fluid outlet are each further provided with a temperature detector configured to detect the temperature of the fluid and a flow detector configured to detect flow of the fluid.

7. The device according to claim 1, wherein an extraction opening configured for vacuumizing is provided on the top of the process chamber, and the extraction opening is connected to a vacuum pump through a vacuumizing pipeline.

8. A method for removing metal gallium based on a device for removing metal gallium, wherein the device comprises a process chamber; the method comprises:
    providing a temporary storage substrate after laser lift-off performed by a laser lift-off device, wherein multiple Micro Light Emitting Diode (Micro-LED) chips are adhered to the temporary storage substrate, wherein the laser lift-off device comprising a lift-off chamber, the device for removing metal gallium is placed inside the lift-off chamber;
    transferring the temporary storage substrate into the process chamber; and
    introducing a specific amount of fluid into the process chamber to remove residual metal gallium on surfaces of the multiple Micro-LED chips,
    wherein a temperature of the fluid is greater than or equal to a melting point of metal gallium.

9. The method according to claim 8, wherein the process chamber comprises a fluid inlet and a fluid outlet; and introducing the fluid into the process chamber to remove the residual metal gallium on the surfaces of the multiple Micro-LED chips comprises:
    closing the fluid outlet, and introducing the fluid into the process chamber through the fluid inlet;
    in a process of introducing the fluid, detecting a liquid level and a temperature of the fluid in the process chamber in real time; and
    in response to detecting that the liquid level and the temperature of the fluid in the process chamber reach preset parameters, opening the fluid outlet, so that the fluid carrying metal gallium flows out of the fluid outlet.

10. The method according to claim 8, before introducing the fluid into the process chamber, further comprising:
    checking whether a vacuum degree in the process chamber meets a preset requirement or not.

11. The method according to claim 10, wherein the predetermined required vacuum degree is 5.0 Pa to 0.2 Pa.

12. The method according to claim 8, before introducing the fluid into the process chamber, further comprising:
    introducing inert gas into the process chamber, wherein the inert gas comprises one or more of helium, argon and nitrogen.

13. The method according to claim 8, wherein the fluid does not react with the multiple Micro-LED chips.

14. The method according to claim 13, wherein the fluid comprises one or more of deionized water, ethanol and ultrapure water.

15. The method according to claim 8, wherein the temperature is 29.78 degree Celsius to 90 degree Celsius.

16. A laser lift-off system, comprising:
a laser lift-off device, configured to separate a temporary storage substrate adhered with multiple Micro Light Emitting Diode (Micro-LED) chips from a growth substrate;
a device for removing metal gallium, wherein the device comprises a process chamber, and fluid used for removing metal gallium left on the surfaces of the multiple Micro-LED (Micro-LED) chips after laser lift-off is contained in the process chamber, and a temperature of the fluid is greater than or equal to a melting point of metal gallium; and
a transfer device, configured to transfer the temporary storage substrate after laser lift-off into the process chamber;
wherein the laser lift-off device further comprises a lift-off chamber inside which the device for removing metal gallium is placed.

17. The laser lift-off system according to claim 16, wherein the laser lift-off device comprises:
a laser source, configured to emit laser at a preset wavelength;
a laser galvanometer, arranged on a light outlet path of the laser source; and
a control device, electrically connected with the laser source and configured to shape the laser emitted by the laser source into light spots with a preset size.

18. The laser lift-off system according to claim 17, wherein the light spots comprise linear light spots or point-shaped light spots.

19. The laser lift-off system according to claim 18, wherein the area of the point-shaped light spots is 600 μm2 to 620 μm2.

* * * * *